United States Patent [19]

van de Grift

[11] 4,456,904
[45] Jun. 26, 1984

[54] ANALOG-TO-DIGITAL CONVERTER CIRCUIT

[75] Inventor: Robert E. J. van de Grift, Eindhoven, Netherlands

[73] Assignee: U.S. Philips Corporation, New York, N.Y.

[21] Appl. No.: 320,363

[22] Filed: Nov. 12, 1981

[30] Foreign Application Priority Data

Dec. 23, 1980 [NL] Netherlands ............ 8006995

[51] Int. Cl.³ ......................................... H03K 13/175
[52] U.S. Cl. ............................................. 340/347 AD
[58] Field of Search ................................ 340/347 AD

[56] References Cited
U.S. PATENT DOCUMENTS 4,129,864 12/1978 Carpenter ............... 340/347 AD

OTHER PUBLICATIONS

Arbel, "IEEE Transactions on Nuclear Science," vol. NS-22, Feb. 1975, pp. 446–451.

Primary Examiner—C. D. Miller
Attorney, Agent, or Firm—Thomas A. Briody; William J. Streeter; Edward W. Goodman

[57] ABSTRACT

In order to avoid errors due to time differences between output signals containing coarse bit information and fine bit information, an insertion circuit (77) is used in an analog-to-digital converter, having a coarse converter (5, 33) and two folding circuits (9, 13) which are each followed by a fine converter (19, 25, 33), to replace changing coarse bit information with changing fine bit information in the output signals.

1 Claim, 4 Drawing Figures

| V/16 | $a_1$ | $a_2$ | $a_3$ | $b_1$ | $b_2$ | $b_3$ | $g_0$ | $g_1$ | $g_2$ | $g_3$ | $g_4$ |
|---|---|---|---|---|---|---|---|---|---|---|---|
| 1 | 0 | 1 | 1 | 0 | 0 | 0 | X | 0 | 0 | 0 | 0 |
| 2 | 1 | 1 | 1 | 0 | 0 | 1 | 1 | 0 | 0 | 0 | 0 |
| 3 | 1 | 1 | 1 | 0 | 1 | 1 | 1 | 0 | 0 | 0 | 0 |
| 4 | 0 | 1 | 1 | 1 | 1 | 1 | 1 | X | 0 | 0 | 0 |
| 5 | 0 | 0 | 1 | 1 | 1 | 1 | 1 | X | 0 | 0 | 0 |
| 6 | 0 | 0 | 0 | 0 | 1 | 1 | 1 | 1 | 0 | 0 | 0 |
| 7 | 0 | 0 | 0 | 0 | 0 | 1 | 1 | 1 | 0 | 0 | 0 |
| 8 | 0 | 0 | 1 | 0 | 0 | 0 | 1 | 1 | X | 0 | 0 |
| 9 | 0 | 1 | 1 | 0 | 0 | 0 | 1 | 1 | X | 0 | 0 |
| 10 | 1 | 1 | 1 | 0 | 0 | 1 | 1 | 1 | 1 | 0 | 0 |
| 11 | 1 | 1 | 1 | 0 | 1 | 1 | 1 | 1 | 1 | 0 | 0 |
| 12 | 0 | 1 | 1 | 1 | 1 | 1 | 1 | 1 | 1 | X | 0 |
| 13 | 0 | 0 | 1 | 1 | 1 | 1 | 1 | 1 | 1 | X | 0 |
| 14 | 0 | 0 | 0 | 0 | 1 | 1 | 1 | 1 | 1 | 1 | 0 |
| 15 | 0 | 0 | 0 | 0 | 0 | 1 | 1 | 1 | 1 | 1 | 0 |
| 16 | 0 | 0 | 1 | 0 | 0 | 0 | 1 | 1 | 1 | 1 | X |

ANALOG-TO-DIGITAL CONVERTER CIRCUIT

BACKGROUND OF THE INVENTION

The invention relates to an analog-to-digital converter circuit comprising a coarse converter coupled to an input for a signal to be converted, and a first and second folding circuit, respectively coupled to that input, a first and a second fine converter, respectively, being coupled to an output of said first and second folding circuits, respectively.

IEEE Transactions on Nuclear Science, February 1975, pages 446-451, FIG. 12 in particular, describes an analog-to-digital converter circuit of the type defined above which is suitable for converting signals having a large bandwidth, such as, for example, video signals in television transmission systems. In a practical embodiment of such a circuit, it was found to be difficult to prevent or compensate for errors caused by a delay between output signals comprising coarse bit information and output signals comprising fine bit information.

SUMMARY OF THE INVENTION

The invention has for its object to provide a solution for this problem.

According to the invention an analog-to-digital converter circuit of the type defined in the preable is characterized in that coupled to an output of the coarse converter, and to outputs of the fine converter there is an insertion circuit for replacing a changing coarse bit information by a changing fine bit information.

By the measure in accordance with the invention, a coarse bit information is now replaced by a fine bit information so that no errors can occur any longer between the relevant coarse bit information and the fine bit information. It has been found that this is possible with this type of converters having parallel-operating folding circuits and fine converters, since one of the fine converters shows a change in one of its output signals at the same input signal level as the level at which a change in an output signal of the course converter occurs.

DESCRIPTION OF THE DRAWINGS

The invention will now be further described by way of example with reference to the accompanying drawings.

In the drawings.

DESCRIPTION OF THE PREFERRED EMBODIMENT

Figure 1:
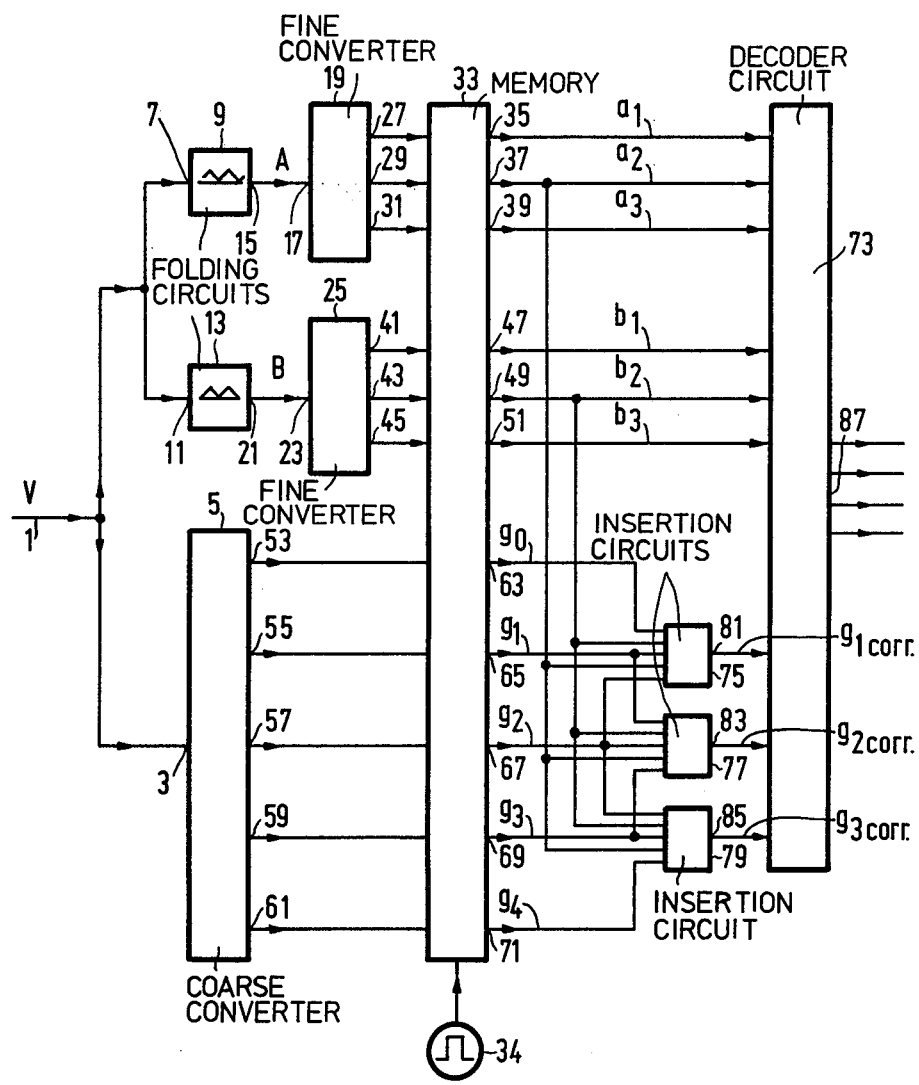
FIG. 1 illustrates, by means of a block schematic circuit diagram, an analog-to-digital converter circuit in accordance with the invention.

In FIG. 1 an analog signal V to be converted is applied to an input 1. This input 1 is connected to an input 3 of a coarse converter 5, to an input 7 of a first folding circuit 9 and to an input 11 of a second folding circuit 13.

Figure 2:
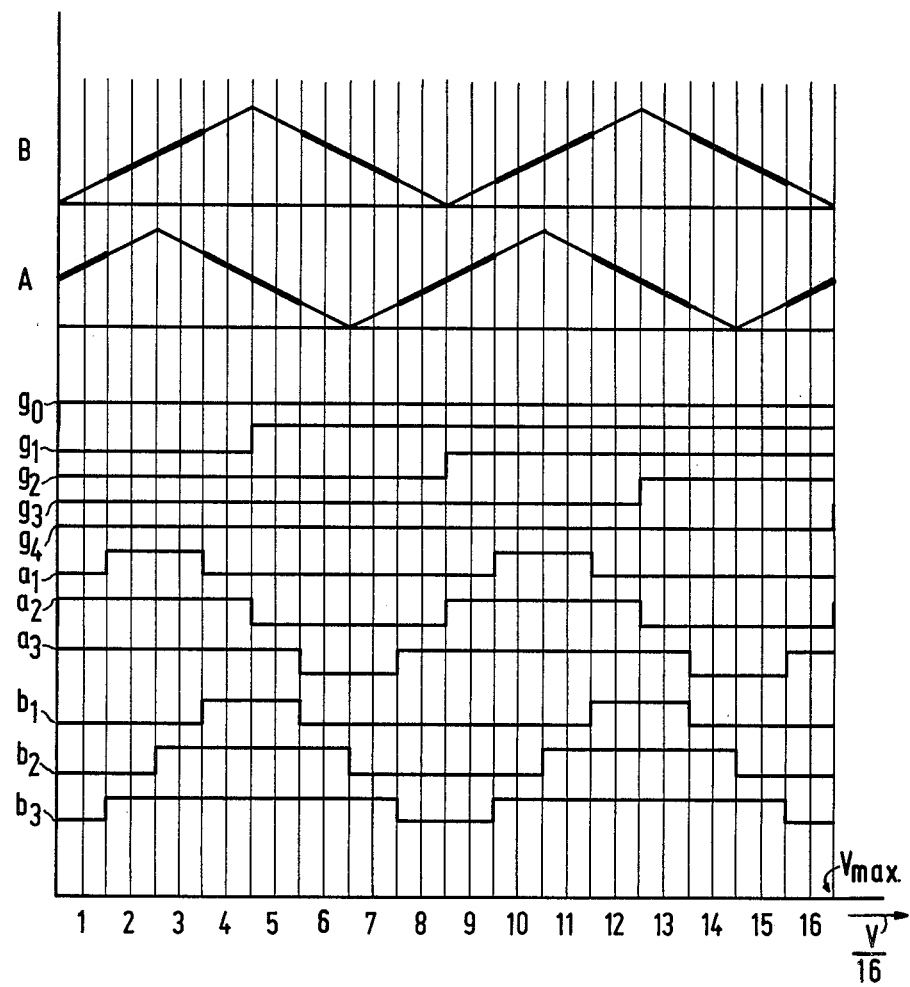
FIG. 2 shows, by means of a number of waveforms, the change in signals in different places in the circuit of FIG. 1 as a function of the amplitude of the converter circuit input signal.

At an output 15, the first folding circuit 9 produces a signal, the waveform of which as a function of the amplitude of the input signal V is designated in FIG. 2 by A. This signal A is applied to an input 17 of a first fine converter 19.

At an output 21, the second folding circuit 13 produces a signal, the waveform of which as a function of the amplitude of the input signal V is designated in FIG. 2 by B. This signal B is applied to an input 23 of a second fine converter 25.

Three outputs 27, 29, 31 of the first fine converter 19 are connected to a memory circuit 33, which is controlled by a clock pulse generator 34 and produces, at the occurrence of a clock pulse at three outputs 35, 37, 39 a, constant logic signal levels corresponding, respectively, with logic signal levels occurring between two consecutive clock pulses at the outputs 27, 29, 31 of the first fine converter 19. These logic signal levels at the outputs 35, 37 and 39, respectively, are shown in FIG. 2 by means of the waveforms $a_1$, $a_2$ and $a_3$, respectively.

In a similar manner, three outputs 47, 49 and 51, respectively, of the memory circuit 33 are coupled to three respective outputs 41, 43 and 45 of the second fine converter 25 and five outputs 63, 65, 67, 69 and 71, respectively, of the memory circuit 33 are coupled to five outputs 53, 55, 57, 59 and 61, respectively, of the coarse converter 5.

Logic signal shapes, which are designated in FIG. 2 by $a_1$, and $a_2$, $a_3$, $b_1$, $b_2$, $b_3$, $g_o$, $g_1$, $g_2$, $g_3$ and $g_4$, respectively, are produced at the outputs 35, and 37, 39, 47, 49, 51, 63, 65, 67, 69 and 71, respectively, of the memory circuit 33.

The outputs 35, 37, 39, 47, 49, 51 of the memory circuit 33 apply fine bit information $a_1$, $a_2$, $a_3$, $b_1$, $b_2$, $b_3$ to a decoder circuit 73, the outputs 65, 67, 69 of the memory circuit 33 apply coarse bit information $g_1$, $g_2$, $g_3$ to three insertion circuits 75 and 77, 79, respectively.

The insertion circuit 75 further receives coarse bit information $g_o$ from the output 63, coarse bit information $g_2$ from the output 67 and fine bit information $a_2$, $b_2$ from the outputs 37 and 49 of the memory circuit 33.

The insertion circuit 77 further receives coarse bit information $g_1$, $g_3$ from the outputs 65 and 69 and fine bit information $a_2$, $b_2$ from the outputs 37 and 49 of the memory circuit 33.

The insertion circuit 79 further receives coarse bit information $g_2$ from the output 67, additional coarse bit information $g_4$ from the output 71 and fine bit information $a_2$, $b_2$ from the outputs 37 and 49 of the memory circuit 33.

The insertion circuits 75, 77, 79, respectively, have outputs 81, 83, 85 from which corrected coarse bit information $g_{1corr}$, $g_{2corr}$ and $g_{3corr}$, respectively, are applied to the decoding circuit 73.

The decoding circuit 73 has an output combination 87 for a binary four-bit code. It is easy for one skilled in the art to design this decoding circuit for the desired code so that said decoding circuit 73 will not be further described.

Figures 3, 4:
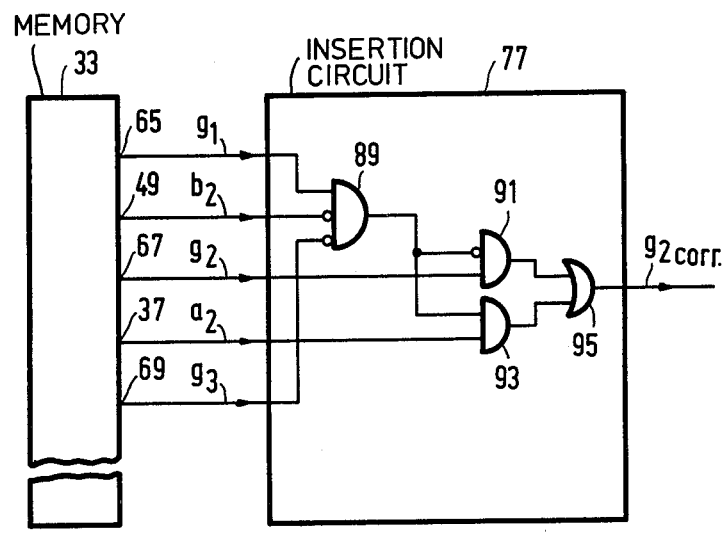
FIG. 3 illustrates, by means of a Table, the coarse and fine bit information in different places in the circuit of FIG. 1 and corresponding with the waveforms shown in FIG. 2.
FIG. 4 shows, by means of a more detailed circuit diagram and, an embodiment of an insertion circuit for the converter circuit shown in FIG. 1.

FIG. 4 shows the insertion circuit 77 in detail. Corresponding components have been given the same reference numerals as in the preceding figures.

From FIG. 2 and the Table of FIG. 3, it can be seen that the coarse bit information $g_2$ to be corrected by the insertion circuit 77 has a transition from logic zero to logic 1 at half the maximum convertable input value $\frac{1}{2}V_{max}$. With respect to the fine bit transitions, this transition in $g_2$ may be somewhat shifted in the time. This would introduce an uncertain factor in the conversion, which is shown in the Table of FIG. 3 for $g_2$ by means of x. This transition in $g_2$ is therefore detected by an AND-gate 89 to which the signals $g_1$, $b'_2$ and $g'_3$ are applied, the accents denoting an inversion.

The transition in $g_2$ occurs at the transition of the value of the input signal from 8 (V/16) to 9 (V/16). The Table of FIG. 3 shows that at these values $g_1=1$, $g_3=0$ and $b_2=0$. This combination of values for $g_1$, $g_3$ and $b_2$ does not further occur so that the AND-gate 89 is suitable for use for the detection, of the transition range for the coarse bit $g_2$.

Using a further gate circuit having two AND-gates 91, 93 and an OR-gate 95 connected to the outputs of these AND-gates, the fine bit information $a_2$ is inserted for $g_2$ in the transition range of $g_2$. To this end the output signal of the AND-gate 89 is applied to the AND-gate 93 to which also the fine bit information $a_2$ is applied. Outside the transition range, the AND-gate 91 passes the coarse bit information $g_2$ on to the OR-gate 95. So the output signal $g_{2corr}$ from the OR-gate 95 is formed in the transition range by a fine bit transition so that between this output signal and the fine bit information at the outputs 35, 37, 39, 47, 49 and 51 of the memory circuit 33 no error due to time differences is produced at the relevant transitions.

For the detection and replacement of the coarse bit transition to be corrected it appears that the adjacent coarse bit information and the central fine bit information are always sufficient to carry our the correction. This also holds for converters for more than four bits.

A similar gate circuit can be designed for the coarse bits $g_1$ and $g_3$, an additional coarse bit information $g_0$ and $g_4$, respectively being generated in the manner shown in FIG. 2 and FIG. 3 for conventional converters, owing to the fact that adjacent coarse bit information is missing.

An AND-gate $b_2 g_0 g'_2$ and $b_2 g_2 g'_4$, respectively may be used to detect the coarse bit transitions to be replaced in $g_1$ and $g_3$, respectively, and $a_2$ in both cases for replacing the coarse bit information by fine bit information.

It will be obvious that the insertion circuits 75, 77, 79 may also be part of the decoding circuit 73 or that they may even be included behind these decoding circuits provided the input signals are adapted.

As a substitute of the above-described insertion circuits, a suitably programmed programmable read-only memory (prom) may, if so desired, be used which, if so desired, may also be programmed as a decoding circuit.

In the embodiment described a bit information occurs simultaneously at several fine converter outputs for different bit transitions. This results in dual information which, if so desired, can be prevented from occurring by omitting from the fine converters 19, 25 the elements providing the fine bit information $a_1$ and $a_3$ or $b_1$ and $b_3$ or $a_1$ and $b_3$ or $a_3$ and $b_1$.

Although in the embodiment described the number of coarse bits and also the number of fine bits is equal to two it will be obvious that different numbers may be opted for and that if so desired also the fine converters, for example, may be capable of producing mutually different numbers of fine bit information.

It will further be obvious that that invention may also be used when a larger number of sequentially arranged folding circuits are provided and the analogue-to-digital converter is divided into more than two bit groups, for example coarse, middle and fine instead or coarse and fine as in the embodiment described. The bit group middle may, for example, be considered as being fine with respect to the bit group coarse, or to be coarse with respect to the bit group fine.

Converters which deviate from the embodiment in the above-described respects are of coarse also considered to be within the protective scope of the application.

What is claimed is:

1. An analog-to-digital converter circuit comprising a coarse converter coupled to an input for a signal to be converted, and a first and second folding circuit, respectively, coupled to said input so that the signal to be converted is fed with the same amplitude to an input of each of said folding circuits, a first and second fine converter, respectively, being coupled to an output of said first and second folding circuits, respectively, the first folding circuit having at least one folding level differing from a folding level of the second folding circuit, characterized in that insertion circuit means are coupled to outputs of the coarse converter and to outputs of both of the fine converters for replacing a changing coarse bit information by a changing fine bit information.

* * * * *